US008675391B2

(12) United States Patent
Snider

(10) Patent No.: US 8,675,391 B2
(45) Date of Patent: Mar. 18, 2014

(54) REFRESHING MEMRISTIVE SYSTEMS

(75) Inventor: Gregory Stuart Snider, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/383,599

(22) PCT Filed: Apr. 19, 2010

(86) PCT No.: PCT/US2010/031646
§ 371 (c)(1),
(2), (4) Date: Jan. 12, 2012

(87) PCT Pub. No.: WO2011/133139
PCT Pub. Date: Oct. 27, 2011

(65) Prior Publication Data
US 2013/0028004 A1    Jan. 31, 2013

(51) Int. Cl.
*G11C 11/21*    (2006.01)
(52) U.S. Cl.
USPC ........................................................ 365/148
(58) Field of Classification Search
None
See application file for complete search history.

(56) References Cited

U.S. PATENT DOCUMENTS

| | | | | |
|---|---|---|---|---|
| 5,262,982 A | * | 11/1993 | Brassington et al. | ......... 365/145 |
| 2009/0024904 A1 | | 1/2009 | Roohparvar et al. | |
| 2009/0095985 A1 | | 4/2009 | Lee et al. | |

OTHER PUBLICATIONS

Ho et al.. ("Nonvolatile Memristor Memory: Device Characteristics and Design Implications", provided with Jan. 12, 2012 IDS).*
Ho et al. ("Nonvolatile Memristor Memory: Device Characteristics and Design Implications", provided in Jan. 12, 2012 IDS).*
Yenpo Ho et al., 'Nonvolatile memristor memory: Device characteristics and 1 design implications.' In IEEE/ACM International Conference on Computer-Aided Design—Digest of Technical Papers, pp. 485-490, Dec. 28, 2009.

* cited by examiner

*Primary Examiner* — Hoai V Ho
*Assistant Examiner* — James G Norman

(57) ABSTRACT

A method for operating a circuit (100) containing memristive devices (130) senses respective states of a plurality of memristive devices (130) and refreshes the respective states of the memristive devices (130) according to the states sensed. A memristive device (100) including an array of memristive devices (130) between crossing lines (110 and 120) includes logic that senses respective states of memristive devices (130) and refreshes the respective states of the memristive devices (130) according to the states sensed.

17 Claims, 2 Drawing Sheets

REFRESHING MEMRISTIVE SYSTEMS

STATEMENT OF GOVERNMENT INTEREST

This invention has been made with government support under contract No. HR0011-09-3-0001, awarded by the Defense Advanced Research Project Agency. The U.S. government has certain rights in the invention.

BACKGROUND

Memristive memory has the potential for high-density, low-cost storage of data. Some memristive devices, though, are subject to decay or perturbation of state information, which can lead to corruption of data stored in the devices. Other types of memory devices are also known to suffer from decay and perturbation of stored data. For example, binary DRAM uses capacitors that store electric charge representing respective bits and therefore suffers from decay processes (due to charge leakage) that threaten the integrity of stored data. DRAM commonly addresses the problem of charge leakage using refresh cycles to preserve data. Each refresh cycle generally involves reading the stored charge (e.g., the voltage) on a capacitor, deciding whether that charge represents a 0 or 1 bit, then writing the bit value read back to the capacitor. Since the capacitor's charge may have decayed since last being written, the capacitor voltage read is commonly compared to a threshold voltage, and if the voltage read is above the threshold voltage, the capacitor is written to the fully charged state. Otherwise, the refresh operation discharges the capacitor to the fully discharged state.

BRIEF DESCRIPTION OF THE DRAWINGS

Use of the same reference symbols in different figures indicates similar or identical items.

DETAILED DESCRIPTION

In accordance with an aspect of the invention, refresh processes for memristive devices can be interleaved with read or write operations and can use available read and write circuits. The frequency or timing of the refresh processes may be adjusted as necessary to accommodate the data corruption rate expected for the particular type of memristive device, the arrangement of the memristive devices in an array or network, and the number of performed operations that may have disturbed the memristive devices. In accordance with a further aspect of the invention, a refresh of multiple binary memristive devices can be performed in a two step process that refreshes devices storing one binary value 0 or 1 during a first step and refreshes devices having the other binary value 1 or 0 during a second step. Each step uses a pair of drivers. In each step, one driver applies a pulse having a polarity selected according to the state of the memristive device being refreshed. The other driver applies pulses with predetermined polarities, e.g., applies a pulse of one polarity during a first step of the refresh process and applies a pulse of an opposite polarity during the second step of the refresh process.

Figure 1:
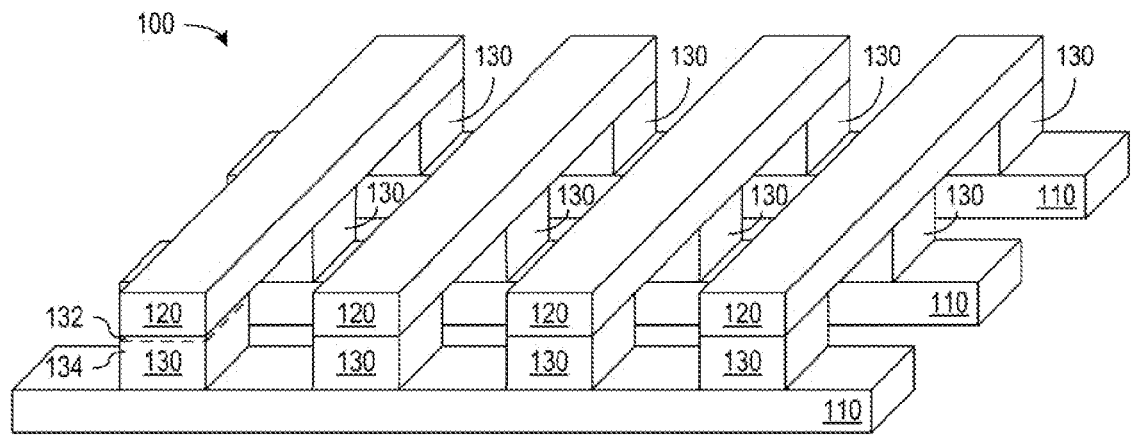
FIG. 1 shows a perspective view of a crossbar array of memristive devices.

FIG. 1 shows a perspective view of a portion of a memristive array 100, which may be used to store binary data. For simplicity and to better illustrate the electrical connections of memristive devices, the portion of array 100 illustrated in FIG. 1 does not include any underlying substrate or structures, insulating regions, or overlying structures, which may be integrated in the same die with the illustrated portion of array 100. Array 100 as shown has a crossbar structure and includes lower wires 110, upper wires 120, and regions 130 of memristive material at intersections of wires 110 and 120. Wires 110 are generally parallel to each other and may be perpendicular to wires 120. As a convention used herein, wires 110 and 120 are sometimes referred as row lines 110 and column lines 120, respectively, although the selection of which wires 110 or 120 correspond to rows or columns of array 100 is arbitrary. Wires 110 or 120 may also be referred to as nanowires since in an exemplary embodiment the width and thickness of wires 110 and 120 may be a few tens of nanometers or less. Memristive regions 130 correspond to respective intersections where two wires 110 and 120 cross. In the illustrated embodiment, each memristive region 130 is in direct electrical contact with a lower wire 110 and an upper wire 120.

U.S. Pat. App. Pub. No. 2008/0090337, entitled "Electrically Actuated Switch," to R. Stanley Williams describes some suitable memristive devices for memristive regions 130 and fabrication techniques for arrays of memristive devices and is hereby incorporated by reference in its entirety. In general, wires 110 and 120 can be made of any conductive material but would typically be made of a metal such as platinum. A typical structure for memristive regions 130 includes a layer 132 of a source material and a layer 134 of primary material. The primary material is generally a material that provides mobility to dopants from the source material, where the mobility of dopants in the primary material is such that an applied electric field of sufficient magnitude can drive some of the dopants from the source material layer 132 into the primary material 134 (or drive the dopants out of the primary material layer 134 into the source material layer 132.) The primary material is also such that the introduction of the dopants changes electrical properties of the primary material layer 134. In a typical configuration, memristive region 130 may be about 20 to 200 nm thick, with source layer being less a few nanometers thick or less in a manner similar to a delta-doped layer.

An exemplary primary/source material combination is titanium dioxide ($TiO_2$) and oxygen depleted titanium dioxide ($TiO_{2-x}$). $TiO_2$ is a wide-band semiconductor in its intrinsic state but becomes a narrow-band semiconductor when oxygen vacancies are introduced. Oxygen vacancies have a relatively positive charge due to the high electron affinity of oxygen atoms, and an applied electric field (i.e., a voltage difference between a selected row line 110 and a selected column line 120) of sufficient magnitude can drive oxygen vacancies from the source material ($TiO_{2-x}$) into the primary material ($TiO_2$) or equivalently drive oxygen ions from the primary material into the source material. Thus, a high enough voltage and the resulting current of oxygen vacancies can significantly increase the conductivity of the primary material in a region 130 between the selected lines 110 and 120. Similarly, an electric field that is sufficient to drive oxygen vacancies from the primary material ($TiO_2$) back into the source material ($TiO_{2-x}$) can significantly decrease the conductivity of the primary material. When the combination of layers 132 and 134 is on the order of hundreds or tens of nanometers thick, the change in resistance can generally be switched in times on the order of milliseconds to nanoseconds. Some other combinations, of primary/source materials suitable for layers 134 and 132 include: $ZrO_2/ZrO_{2-x}$, $HfO_2/HfO_{2-x}$, and $SrTiO_3/SrTiO_{3-x}$, which use oxygen vacancies as mobile dopants; $GaN/GaN_{1-x}$, which uses nitrogen vacancies as mobile dopants; $CuCl/CuCl_{1-x}$, which uses chlorine vacancies as mobile dopants; GaN/GaN:S, which uses sulfide ions as mobile dopants; and amorphous silicon and silver (a-Si/Ag), which uses silver ions as mobile dopants. Other types of memristive materials for regions 130 could alternatively be employed in array 100 and may or may not include source and primary layers 132 and 134.

FIG. 1 shows a configuration where source material 132 is on top of primary material 134. When the mobile ions have positive charge, e.g., as is the case for oxygen vacancies, a memristive region 130 can be driven to a more conductive state by a voltage on upper wire 120 that is sufficiently positive relative to the voltage on the crossing lower wire 110. Similarly, when the mobile ions have positive charge, a memristive region 130 can be driven to a less conductive state by a voltage on upper wire 120 that is sufficiently negative relative to the voltage on the crossing lower wire 110. These relative polarities would be reversed if the mobile ions in source layer 132 were negative or if source material 132 were adjacent to lower wires 110.

Each memristive region 130, whatever its construction, in array 100 is generally capable of being placed into a continuum of resistance states, but for storage of binary data, the impedances states can be divided in two groups. One group corresponds to higher impedance (e.g., impedance above a threshold level) and represents to one binary value 0 or 1, and the other group corresponds to lower impedance (e.g., impedance lower than the threshold) and represents the other binary value 1 or 0. A write operation pushing a memristive region 130 to a higher (or lower) impedance state would normally drive the memristive region 130 to an impedance that is above (or below) the threshold level by a sufficient margin, so that the impedance of the region 130 can drift (e.g., as the result of relaxation of the memristive state or electrical disturbances) and still represent the correct binary value.

The behavior of memristive devices such as regions 130 can generally be described by Equations 1 and 2 below. In Equations 1 and 2, W is one or more state variables (e.g., dopant concentration in the primary material) of the memristive device, V is the voltage drop across the memristive device, and I is the current through the memristive device. The function f is typically nonlinear in currents or voltage V, such that small currents through or voltages across the memristive device have little impact on the evolution of state variable W, while marginally larger currents or voltages induce rapid changes in state variable W. The function g describes the conductance of the memristive device, which may be nonlinear in the applied voltage V.

$$\frac{dW}{dt} = f(W, I, V) \quad \text{Equation 1}$$

$$I = g(W, V)V \quad \text{Equation 2}$$

Two distinguishable impedance states of each memristive region 130 are sufficient for use of array 100 as a binary memory. A high impedance state represents one binary value (e.g., 0 bit), and a low impedance state represents the other binary value (e.g., a 1 bit). Small voltages applied across a memristive region 130 can be used to read the state of the region 130 without changing the state because of the nonlinearity in state evolution as indicated in Equation 1 and described above. Somewhat larger voltages across a region 130 can be used to change the state and write a bit to the memristive region 130. The nonlinearity for changes in the state variable (i.e., in Equation 1) causes each memristive region 130 to effectively have two "switching thresholds": a positive "on" threshold and a negative "off" threshold. If the applied voltage across a memristive region 130 exceeds (e.g., is more positive than) the "on" threshold for a brief interval (nanoseconds to microseconds), the memristive regions 130 unconditionally switches to the low impedance or 1 state, regardless of its previous state. Similarly, if the applied voltage across a memristive region 130 is less than (e.g., more negative than) the "off" threshold for a brief interval, the memristive region 130 unconditionally switches to the high impedance or 0 state. In general, the concept of switching thresholds is only an approximation, and over time, subthreshold spikes in voltage applied across a memristive region 130 and internal relaxation processes in the material of a memristive region 130 can cause the actual state of the memristive region 130 to drift away from the states set during a write operation.

Figure 2:
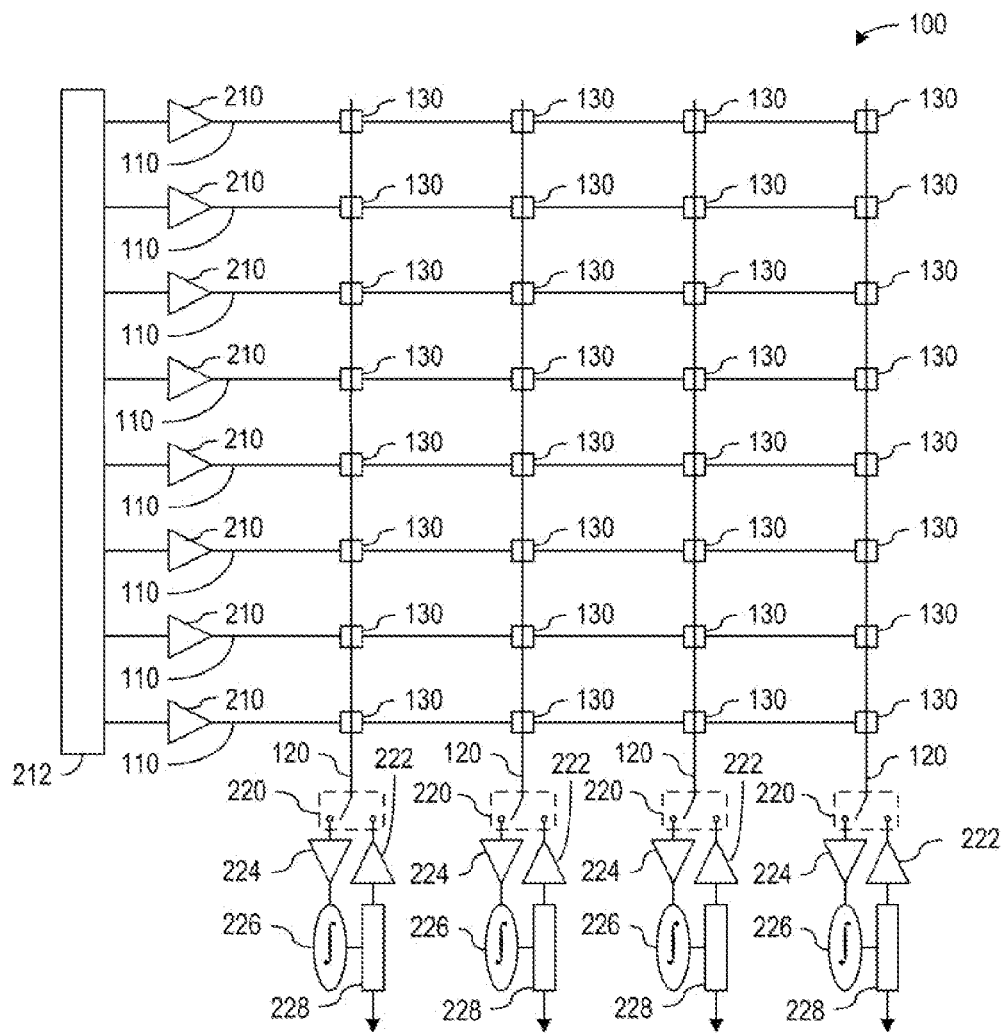
FIG. 2 is a circuit diagram of an array of memristive devices with peripheral circuits for reading, writing, and refreshing the memristive devices.

FIG. 2 is a circuit diagram representing memristive array 100 and associated peripheral circuitry, which can be fabricated using conventional semiconductor processing techniques in the same integrated structure or semiconductor die as array 100 of FIG. 1. In the illustrated embodiment, the peripheral circuitry includes row drivers 210 connected to row lines 110. For memory applications, row logic and address decoders 212 can select a row of array 100 and activate a driver 210 corresponding to the selected row. The driver 210 for the selected row can drive a corresponding row line 110 with different voltages for a write, read, or refresh operation that may affect one, multiple, or all memristive devices in the selected row.

Figure 3:
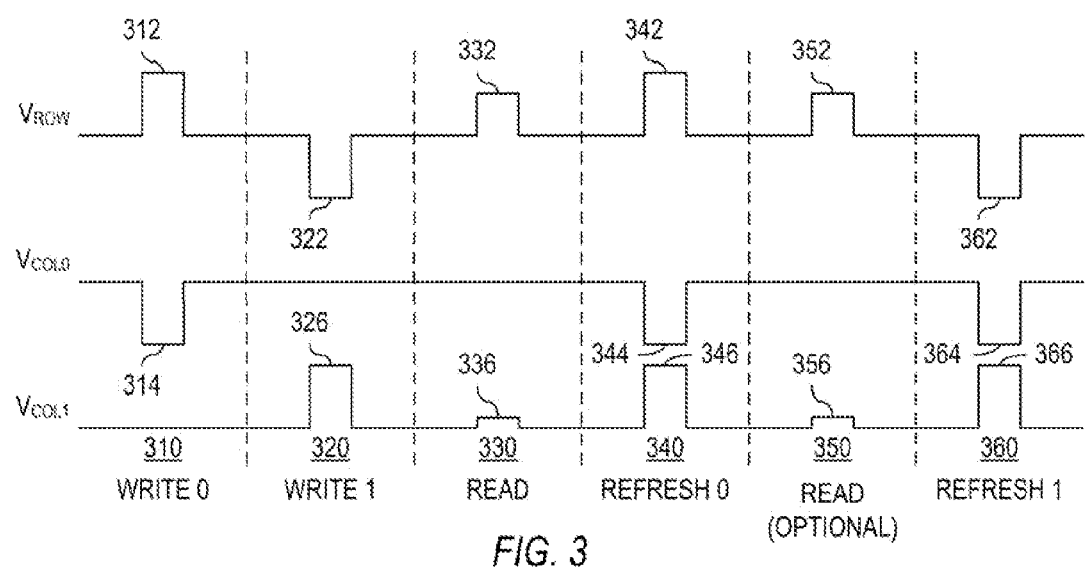
FIG. 3 is a timing diagram illustrating signals used in exemplary write, read, and refresh operations in accordance with an embodiment of the invention.

Read/write switches 220 connect respective wires or column lines 120 to respective column drivers 222 for a write operation or sense amplifiers 224 and integrators 226 for a read operation. When writing to one or more selected columns, switches 220 for the selected columns connect the associated column drivers 222 to respectively drive the selected column wires 120 and disconnects sense amplifiers 224 from column lines 120. (Typically, multiple memristive devices 130 in the selected row would be written or read at a time.) For a typical write protocol, row drivers 210 for all rows, except a selected row, drive a ground signal on wires 110, while the row driver 210 for the selected row emits a pair of voltage spikes, one positive and one negative. FIG. 3 is a timing diagram showing writing of a memristive device 130 in array 100 to a high impedance state (e.g., a bit value 0) during an interval 310 and writing another memristive device 130 in the same row to a low impedance state (e.g., bit value 1) during another interval 320. Signal $V_{ROW}$ on the selected row line has a positive pulse 312 during interval 310 and a negative pulse during interval 320. The column drivers 222 for all columns except the selected columns drive a ground signal on respective column lines 120 during interval 310. Each column driver 220 for a selected column drives either a negative pulse 314 that aligns in time with positive pulse 312 in signal $V_{ROW}$ on the selected row line 110, or a positive pulse 326 that aligns in time with negative pulse 322 in signal $V_{ROW}$. FIG. 3 shows a signal $V_{COL0}$ on a selected column line 120 in which the memristive device 130 in the selected row is written to the high impedance state and a signal $V_{COL1}$ on a selected column line 120 in which the memristive device 130 in the selected row is written to the low impedance state.

During interval 310, the combination of negative pulse 314 and positive pulse 312 causes a negative voltage drop (from column line 120 to row line 110) across a selected memristive device 130 equal to the sum of the amplitudes of pulses 312 and 314, and the magnitudes, opposite polarities, and durations of simultaneous pulses 312 and 314 are such that pulses 312 and 314 force a selected memristive device into the high impedance state. In particular, although both pulses 312 and 314 may have sub-threshold amplitudes, the sum of the amplitudes can be more negative than the "off" switching threshold of a memristive device 130, and the selected memristive device 130 is driven to the high impedance or 0 state. Memristive devices 130 that are in the same selected column but not the selected row experience only the sub-threshold pulse 314 during interval 310 and are not switched from their current states. Similarly, memristive devices 130 that may be in the selected row but not in one of the selected columns experience only the sub-threshold pulse 312 during interval 310 and are not switched from their current states.

During interval 320, the combination of positive pulse 326 and negative pulse 322 causes a positive voltage drop (from column line 120 to row line 110) across another memristive device 130, and the magnitudes, opposite polarities, and durations of simultaneous pulses 322 and 326 are such that pulses 322 and 326 force the memristive device 130 into the low impedance state. Again, memristive devices 130 that are in not in a selected column or the selected row experience at most experience a sub-threshold pulse and are not switched from their current states during interval 320.

The write protocol of FIG. 3 may be generalized for other applications of memristive devices, such as for neuromorphic computing. For example, in an application where all or multiple selected memristive devices 130 within a selected column need to be written to the same state, the column driver 220 for the selected column drives a pulse of a polarity (negative or positive) selected depending on the bit value being written, and drivers 210 for selected rows drive respective pulses of the opposite polarity (positive or negative).

Read/write switches 220 of FIG. 2 disconnect drivers 222 and connect sense amplifiers 224 to column lines 120 during a read operation as illustrated in interval 330 of FIG. 3. During interval 330, the selected row driver 210 drives the selected row line 110 with a pulse 332 in signal $V_{ROW}$. Read pulse 332, which may have but is not required to have the same amplitude as write pulse 312, is a sub-threshold voltage pulse that (by itself) will not significantly change the conductivity states of the memristive regions 130. During interval 330, signal $V_{COL0}$ on a selected column line 120 that is connected to a row line 110 through a memristive region 130 in the high impedance state remains at a virtual ground established by the corresponding sense amplifier 224 and little or no current flows through that column line 120 to the associated sense amplifier 224. Signal $V_{COL1}$ on a selected column line 120 connected to the selected row line 110 through a memristive region 130 that is in the low impedance state receives a current/voltage pulse 336 that flows through the attached memristive device 130 in the selected row. Each sense amplifier 224 presents a virtual ground to the connected wire 120, allowing conversion of sub-threshold voltage pulse 312 into a current spike (e.g., pulse 336) at the sense amplifier 224. Each integrator 226 integrates a corresponding current spike and holds a voltage level for input to logic 228, which discriminates between conductivity states of the corresponding memristive region 130 in the selected row. Thus, multiple memristive regions 130 in array 100 can be read by driving a single row line 110 with a sub-threshold voltage pulse 332 while multiple column lines 120 are at virtual ground associated with respective sense amplifiers 224.

Memristive arrays, as noted above, are not limited to performing memory operations such as read and write operations. For example, array 100 can use a process similar to a read operation to detect a dot product of an input voltage vector on row lines 110 and a matrix of state values of memristive regions 130, as long as the resistance of wires 110 and 120 is negligible relative to the ON resistance of the memristive regions 130. In particular, Equation 3 shows the relationship of currents $I_j$ on the jth column line 120 to the voltages $V_i$ on the ith row line 110. In Equation 3, which follows from Ohm's law, i and j are row and column indices, $W_{ij}$ is the state value of the memristive region 130 in the ith row and jth column, and g is the conduction function for memristive regions 130 as in Equation 2 above:

$$I_j = \sum_i V_i g(W_{ij}, V_i) \qquad \text{Equation 3}$$

Data storage and logic operations that require retaining the impedance states of memristive devices are subject to errors if the impedance state of a memristive device changes, for example, due to disturbances caused by read or write operations for other memristive devices or because of inherent relaxation or changes in the material of the memristive device. FIG. 3 illustrates a pair of refresh cycles 340 and 360 that can be employed to reset memristive devices 130 back to their freshly written states. More generally, refresh cycles such as refresh cycles 340 and 360 can be periodically interleaved with normal read and write cycles to restore any decayed or perturbed memristive device state in the array. Each refresh operation includes a "0" cycle 340, used to refresh memristive devices in a row back to the 0 state, and a "1" cycle 360, used to refresh memristive devices in a row back to the 1 state.

During each refresh cycle 340 or 360, one type of driver 210 or 220 drives the connected line(s) 110 or 120 with a pulse of a predetermined polarity and voltage, while the other type of driver 220 or 210 drives the connected lines 120 or 110 with a pulse having a polarity or voltage that depends on the state of the memristive device(s) being refreshed. In the timing diagram of FIG. 3, row logic and decoders 212 control a row line driver 210 to drive the selected line 110 with refresh pulses 342 and 362 having polarity and voltage that do not depend on the state read from any specific memristive device 130. In the illustrated embodiment of FIG. 3, the selected row line driver 210 drives a positive polarity pulse 342 in signal $V_{ROW}$ during interval 340 and drives a negative polarity pulse 362 in signal $V_{ROW}$ during interval 360. As described further below, different protocols for the polarities of pulses 342 and 362 could be employed in refresh operations.

Selected drivers 220 drive respective column lines 120 during refresh cycles 340 and 360 with refresh pulses 344, 346, 364, and 366 having polarity or voltage selected according to the states of the respective memristive devices 130 being refreshed. Preferably, pulses 342, 344, 346, 362, 364, and 366 have sub-threshold amplitudes. In the example of FIG. 3, one column driver 220 drives signal $C_{COL0}$ with negative polarity pulses 344 and 364 during respective refresh cycles 340 and 360 in response a read operation (e.g., during interval 330 or 350) indicating the high impedance state for the corresponding memristive device 130, i.e., the connected memristive device 130 in the selected row stores bit value 0. Similarly, another column driver 220 drives signal $V_{COL1}$ with positive polarity pulses 346 and 366 during respective refresh cycles 340 and 360 in response to a read operation (e.g., during interval 330 or 350) indicating the corresponding memristive device 130 is in the low impedance state.

During refresh cycle 340, positive pulse 342 in signal $V_{ROW}$ combined with negative pulse 344 apply a voltage that is the same as used for writing the high impedance state. Accordingly, the memristive device 130 read to have a higher impedance state is refreshed to the original high impedance state achieved by a write operation. However, positive pulse 342 on the selected row line and positive pulse 346 on the column line corresponding to a memristive device read to have a lower impedance state applies no net voltage if the amplitudes of pulses 342 and 346 are equal or at most a sub-threshold voltage if pulses 342 and 346 are not exactly equal.

Refreshing the low impedance state works in a similar manner. The selected row driver 210 first drives a read pulse 352 in interval 350 followed by a negative pulse 362. If sense amplifier 224 detects a read pulse 356 in signal $V_{COL1}$, the associated column driver 222 drives a negative pulse 366 that aligns in time with positive pulse 362. The resulting combined voltage drop across the selected memristive device is above the "on" threshold and thus writes that memristive device 130 back to the low impedance state. A sense amplifier 224 detect fails to detect a pulse in signal $V_{COL0}$, implying that the corresponding memristive device 130 was in a high impedance state, and the column driver 220 for signal $V_{COL0}$ does not drive a positive pulse, which leave the state of associated memristive device 130 unchanged.

The refresh operation of FIG. 3 can be varied and still refresh memristive devices 130. For example, the refresh protocol of FIG. 3 includes a first read cycle 330 before refresh cycle 340 and a second read cycle 350 before refresh cycle 360, and during the refresh cycles 340 and 360, the selected drivers 220 drive respective column lines 120 with negative or positive pulses depending on value read on the respective rows during the preceding read cycle. This can be achieved, for example, by including a latch or flip-flop in logic 228 that controls associated column drivers 222. However, the second read cycle 350 can be omitted if the read state may be maintained and known from read cycle 330. Further, the order of refresh cycles 340 and 360 is arbitrary and either the high impedance state or the low impedance states may be refreshed first. Further, the example refresh protocol of FIG. 3 is typical for memory applications and has column drivers 220 that drive pulses of polarities that are selected according to the states to be refreshed in respective memristive device in the selected row. However, protocols for refresh operation can also refresh multiple memristive devices in a column and may have row drivers 210 drive pulses having polarities that depend on the state being refreshed, while one or more column drivers drive column lines 120 with pulse having predetermined polarities that are independent of the states being refreshed.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A method for operating a circuit containing memristive devices, the method comprising:
   sensing respective states of a plurality of memristive devices; and
   refreshing the respective states of the memristive devices according to the states sensed, wherein the refreshing comprises:
   during a first cycle, refreshing memristive devices sensed to have a first state and not the memristive devices sensed to have a second state; and
   during a second cycle following the first cycle, refreshing the memristive devices sensed to have the second state.

2. The method of claim 1, wherein refreshing during the first cycle comprises:
   driving a first pulse on a first line that is connected to the memristive devices;
   driving a plurality of second lines that are respectively connected to the memristive devices with a plurality of second pulses that overlap the first pulse in time, wherein each of the second pulses has a characteristic selected according to the state sensed for the memristive device on the second line on which the second pulse is driven.

3. The method of claim 2, wherein refreshing during the second cycle comprises:
   driving a third pulse on the first line;
   driving a plurality of fourth pulses respectively on the second lines, wherein each of the fourth pulses has a characteristic selected according to the state sensed for the memristive device on the second line on which the fourth pulse is driven.

4. The method of claim 3, further comprising sensing the states of the memristive devices at a second time, wherein the second time is between the first cycle pulse and the second cycle, and the respective characteristics of the fourth pulses depend on the states sensed during the second time.

5. The method of claim 3, wherein the characteristics of the second pulses and the characteristics of the fourth pulses are polarities, which are selected according to the respective states sensed for the memristive devices.

6. The method of claim 3, wherein the third pulse has a polarity opposite to a polarity of the first pulse.

7. The method of claim 6, wherein the fourth pulses respectively have the same polarities as the second pulses.

8. The method of claim 2, wherein the first line is a row line of a memory array, and the second lines are column lines of the memory array.

9. The device of claim 1, wherein the first state and the second state correspond to different binary values stored in the memristive devices.

10. A method of for operating a circuit containing memristive devices, the method comprising:
    sensing respective states of a plurality of memristive devices; and
    refreshing the respective states of the memristive devices according to the states sensed, wherein refreshing the respective states comprises:
    driving a first pulse on a first line that is connected to the memristive devices;
    driving a plurality of second lines that are respectively connected to the memristive devices with a plurality of second pulses that overlap the first pulse in time, wherein each of the second pulses has a characteristic selected according to the state sensed for the memristive device on the second line on which the second pulse is driven, and wherein
    the characteristics of the second pulses are polarities of the second pulses, which are selected according to the states sensed for the memristive devices on the second lines on which the second pulses are respectively driven.

11. The method of claim 10, wherein refreshing the respective states further comprises:
    driving a third pulse on the first line;

driving a plurality of fourth pulses respectively on the second lines, wherein each of the fourth pulses has a polarity according to the state sensed for the memristive device on the second line on which the fourth pulse is driven.

12. The method of claim 11, wherein the third pulse has a polarity opposite to a polarity of the first pulse.

13. A device of comprising:

a plurality of first lines;

a plurality of second lines crossing the first lines;

an array of memristive devices located where the second lines cross the first lines, wherein each of the memristive devices controls a resistance to electrical current on a path between one of the first lines and one of the second lines;

a plurality of first drivers respectively associated with the first lines;

a plurality of second drivers respectively associated with the second lines;

a plurality of sensing circuits respectively associated with the second lines; and logic coupled to the sensing circuits and the second drivers, wherein:

the logic operates the second drivers to respectively drive pulses on the second lines during a refresh operation for the memristive devices connected to one or more of the first lines; and the refresh operation includes a first cycle during which memristive devices sensed to have a first state are refreshed and a second cycle during which memristive devices sensed to have a second state are refreshed.

14. The device of claim 13, further comprising logic coupled to the first drivers that control the first drivers so that a selected one of the first drivers drives a selected one of the first lines with a pulse of a first polarity during the first cycle and a pulse of a second polarity during the second cycle.

15. The device of claim 13, wherein the pulses on the second lines during the refresh operation have respective polarities depending on states of the memristive devices sensed by the sensing circuits.

16. The device of claim 15, wherein the refresh operation includes a first read operation and a second read operation, the pulses on the second lines during the first cycle having respective polarities depending on states of the memristive devices sensed by the sensing circuits during the first read operation, the pulses on the second lines during the second cycle having respective polarities depending on states of the memristive devices sensed by the sensing circuits during the second read operation.

17. The device of claim 13, wherein the first state and the second state correspond to different binary values stored in the memristive devices.

* * * * *